United States Patent [19]
Young et al.

[11] Patent Number: 5,627,480
[45] Date of Patent: May 6, 1997

[54] TRISTATABLE BIDIRECTIONAL BUFFER FOR TRISTATE BUS LINES

[75] Inventors: Steven P. Young, San Jose; Trevor J. Bauer, Campbell, both of Calif.

[73] Assignee: Xilinx, Inc., San Jose, Calif.

[21] Appl. No.: 598,308

[22] Filed: Feb. 8, 1996

[51] Int. Cl.$^6$ ................................. H03K 19/01
[52] U.S. Cl. .................. 326/17; 326/57; 326/82
[58] Field of Search .......... 326/17, 31, 57–58, 326/82–83, 86; 327/403–404

[56] References Cited

U.S. PATENT DOCUMENTS

| | | | |
|---|---|---|---|
| Re. 34,363 | 8/1993 | Freeman | 307/465 |
| 4,154,978 | 5/1979 | Tu | 307/242 X |
| 4,419,592 | 12/1983 | Norgren et al. | 307/241 |
| 4,695,740 | 9/1987 | Carter | 307/242 |
| 4,703,198 | 10/1987 | Porter et al. | 307/473 |
| 4,758,745 | 7/1988 | Elgamal et al. | 307/465 |
| 4,835,418 | 5/1989 | Hsieh | 307/473 |
| 5,243,238 | 9/1993 | Kean | 307/465 |
| 5,362,996 | 11/1994 | Yizraeli | 326/86 X |
| 5,455,521 | 10/1995 | Dobbelaere | 326/86 X |

FOREIGN PATENT DOCUMENTS

WO93/05577   8/1992   WIPO.

OTHER PUBLICATIONS

"The Programmable Logic Data Book", available from Xilinx, Inc., 2100 Logic Drive, San Jose, CA 95124, 1994, pp. 2–111 through 2–117 and pp. 2–187 through 2–190.

*Primary Examiner*—David R. Hudspeth
*Attorney, Agent, or Firm*—Edel M. Young

[57] ABSTRACT

The direction of a bidirectional buffer inserted along a bus line is dynamically controlled to be always away from the signal source. The signals which select a tristate buffer to turn on for driving the bus also affect or determine the direction of all buffers inserted in the bus line. Since only one tristate enable signal will be active, the direction which each bidirectional buffer should drive is dynamically determined by the presently active enable signal.

4 Claims, 9 Drawing Sheets

TRISTATABLE BIDIRECTIONAL BUFFER FOR TRISTATE BUS LINES

RELATED PATENT APPLICATIONS

The present application relates to the following patent applications, which are assigned to Xilinx, Inc, assignee of the above application:

1. Application Ser. No. 08/222,138 [M-2257-1N] entitled "Tile Based Architecture for FPGA" which was filed by Danesh Tavana, Wilson K. Yee, and Victor A. Holen on Apr. 1, 1994 and which is incorporated herein by reference.
2. Application Ser. No. 08/507,626 [X-195] entitled "Bidirectional Tristate Buffer with Default Input" which was filed by Steven P. Young on Jul. 26, 1995 and which is incorporated herein by reference.

BACKGROUND OF THE INVENTION

A field programmable gate array (FPGA) comprises an array of programable logic blocks which can be programably interconnected to each other to provide a logic function desired by a user. U.S. Pat. No. 4,870,302, reissued as U.S. Pat. No. Re 34,363 to Ross Freeman describes the first FPGA, and is incorporated herein by reference. Later patents such as U.S. Pat. Nos. 4,758,745 to Elgamal, and 5,243,238 to Kean and published application WO 93/05577 invented by Furtek and owned by Concurrent Logic, Inc. describe other FPGA architectures. These patents and application are also incorporated herein by reference. The Xilinx 1994 Data Book entitled "The Programable Logic Data Book", available from Xilinx, Inc., 2100 Logic Drive, San Jose, Calif. 95124 describes several products which implement FPGA architectures. As illustrated in the Xilinx 1994 Data Book at pages 2–111 through 2–117 and 2–187 through 2–190, incorporated herein by reference, FPGA products typically include a regular array of logic blocks, the number of which varies from one product to another. Long and short lines are available to interconnect logic blocks.

When a signal on a line must drive several loads, it is sometimes necessary to buffer the signal in the mid-portion of the line so that the signal will have sufficient strength to drive the required loads without being excessively slowed by the combination of the load and any resistance on the signal line. But for a field programmable device, the direction of signal flow on bidirectional long lines can not be determined at the time the device is manufactured because one user will program the device for signal flow in one direction along the line and another user will program the device for signal flow in another direction. For such flexibility, bidirectional buffers must be used. Hsieh in U.S. Pat. No. 4,835,418 [M-615] and Young in application Ser. No. 08/507,626 [X-195] (both incorporated herein by reference) describe bidirectional buffer having two control signals, which can buffer a signal in either of two directions between two line segments or can disconnect the two line segments (the tristate condition). The control signals can come from memory cells if the two line segments are to have a static directional relationship and the buffer direction is to remain constant.

Xilinx long lines can be accessed through tristate buffers so they can be used as bus lines. However, if two line segments are part of a single bus line to which input signals are applied from different sources at different times, the buffer direction may need to switch dynamically. Providing dynamic switching requires a control system more sophisticated than simply a pair of memory cells or other static signal sources.

SUMMARY OF THE INVENTION

According to the present invention, the direction of a bidirectional buffer inserted along the bus line is controlled to be always away from the signal source. The signals which select a tristate buffer to turn on for driving the bus also affect or determine the direction of all buffers inserted in the bus line.

In one embodiment, a first OR gate is controlled by all tristate enable signals for bus drivers to its left and a second OR gate is controlled by all tristate enable signals for bus drivers to its right. Since only one tristate enable signal will be active (high in the case of OR gates), only one of the first and second OR gates will have a high output signal. That OR gate will select the direction of all bidirectional buffers on the bus line.

In one embodiment (may work in combination with the above embodiment), periodic buffer enable signals applied to bidirectional buffers within the bus turn off selected bidirectional buffers and thus break the bus into segments. The control structure responds to the high impedance state of the bidirectional buffer and prevents a high tristate enable signal from being propagated beyond the bidirectional buffer that is in a high impedance state. Then, more than one tristate enable signal may be high, one for each segment without contention.

BRIEF DESCRIPTION OF THE DRAWINGS

FIGS. 6a and 6b include OR gates for providing fast paths for long distance signals.

DETAILED DESCRIPTION

Figure 1:
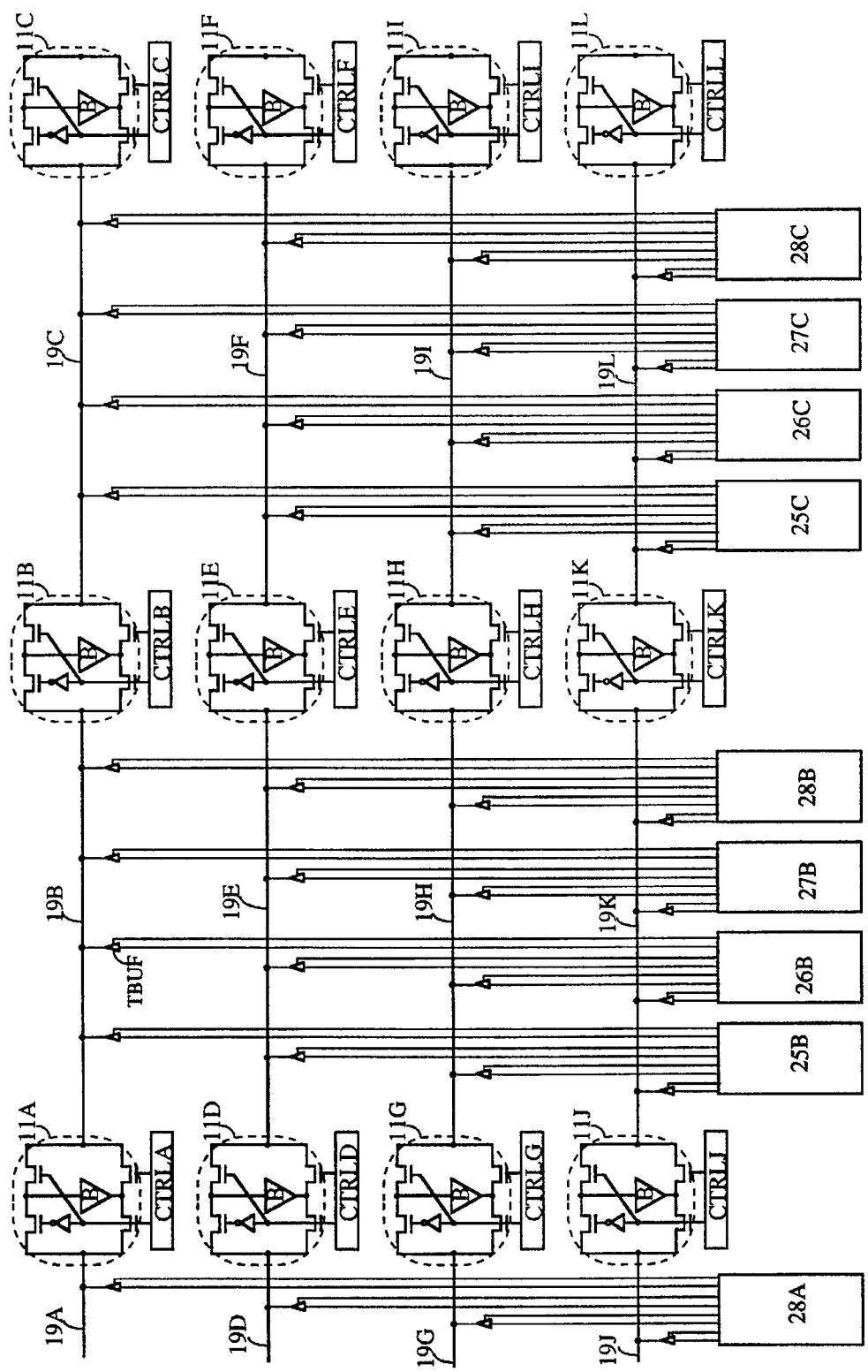
FIG. 1 shows part of an FPGA chip with which the invention may be used.

FIG. 1 shows a portion of an integrated circuit chip which incorporates the invention. Bidirectional buffers 11A through 11L are illustrated. There are four bus lines shown, one of which comprises segments 19A, 19B, and 19C. Each bus line can be driven by tristate buffers controlled by any of logic blocks 28A, 25B through 28B, or 25C through 28C as well as other tristate buffers not shown. To avoid contention, only one of these logic blocks would apply a signal to the bus line comprising segments 19A, 19B, and 19C at any one time. Thus, only one tristate buffer will be turned on at one time for driving a single bus line. Bus line segments 19A, 19B, and 19C are interconnected by bidirectional buffers 11A and 11B. Similarly, line segments 19D through 19L are interconnected by bidirectional buffers 11d through 11L to form three more bus lines as shown.

In a typical integrated circuit logic device, many more logic structures are present than are shown in FIG. 1. In some commercial devices, more than one source from a particular logic block may drive a single bus line. Patent application Ser. No. 08/222,138 [M-2257-1N] describes an FPGA made up of an array of tiles, in which conductive lines connect from one tile to another in order to interconnect the tiles and carry signals from one tile to another. Each tile includes a logic block structure and an interconnect structure. Lines in the interconnect structure of one tile connect to lines in the interconnect structure of adjacent tiles, and form long lines which can be used as buses. In a tile, lines extend from the logic block structure to the interconnect structure and include lines for enabling tristate buffers and driving buses. The present invention can be used with such a structure.

According to the invention, control structures CTRLA through CTRLL determine the direction of signal flow through bidirectional buffers 11A through 11L so that a signal applied to a bus line segment is buffered in a direction away from the signal source as it passes to adjacent segments on the bus line. The direction of the bidirectional buffers changes dynamically in response to a dynamically changing tristate bus control signal.

For example, in the case of a signal applied to bus segment 19B that needs to fan out in both directions in order to reach its intended destination or destinations, bidirectional buffer 11A should be set to propagate the signal to the left and bidirectional buffers 11B and 11C should be set to propagate the signal to the right.

Tristate Enable Signals Control Bidirectional Buffers

Figure 2:
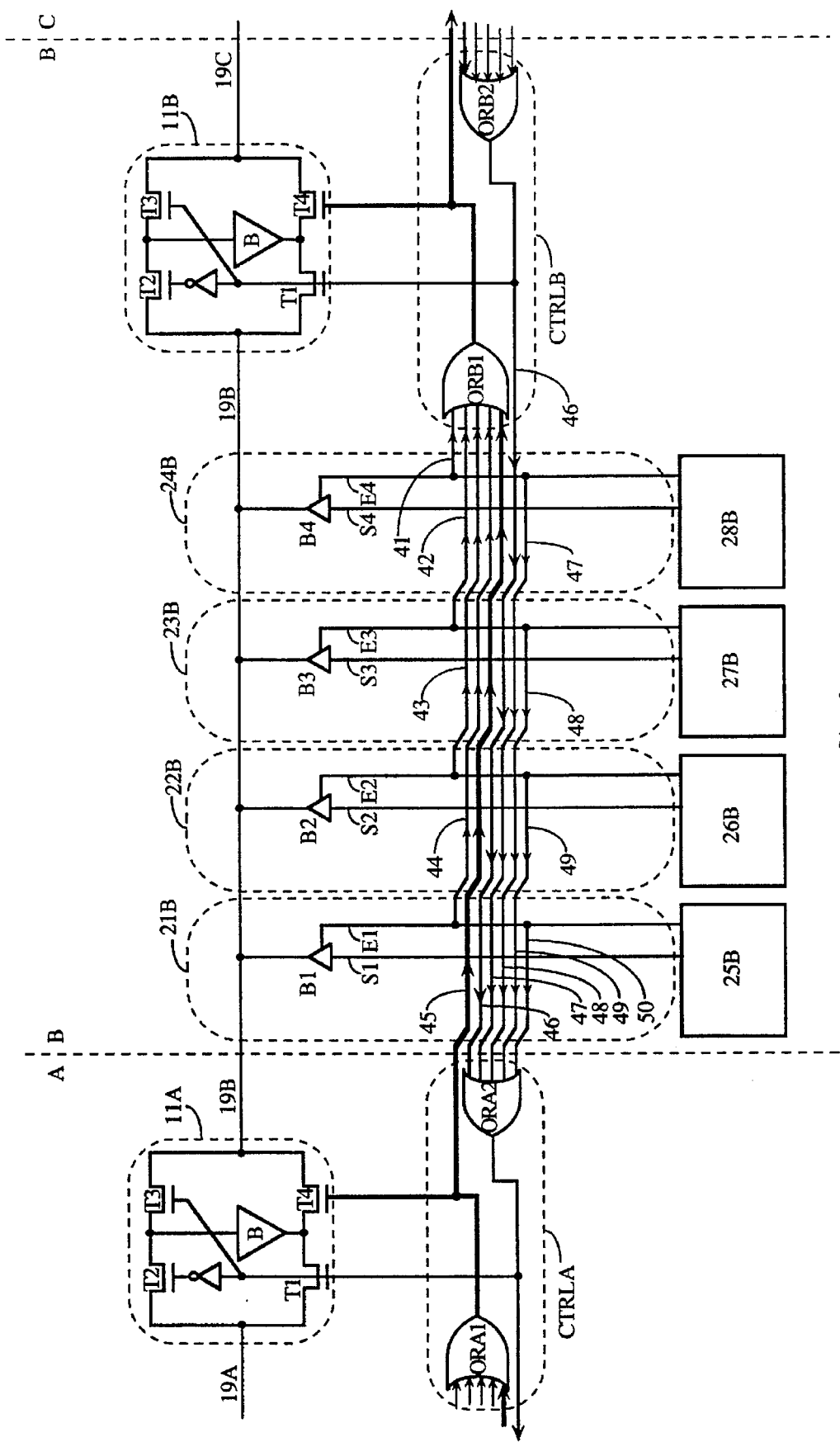
FIG. 2 shows in more detail part of the chip of FIG. 1 illustrating one embodiment of the invention.

FIG. 2 shows in more detail the portion of FIG. 1 comprising bidirectional buffers 11A and 11B and line segments 19A through 19C. As shown in FIG. 2, each enable line for enabling a tristate buffer to drive a line segment is also an input line to a logic gate for directing bidirectional buffers.

Direction Control

Control of bidirectional buffers 11A and 11B is by control units CTRLA and CTRLB respectively. In each control unit, a pair of logic gates selects the direction of signal flow. For example, in bidirectional buffer 11A, OR gates ORA1 and ORA2 select which of transistors T1 through T4 are turned on. As discussed in detail in patent application Ser. No. 08/507,626 [X-195], when transistors T1 and T3 are on, the signal propagates to the left, and when transistors T2 and T4 are on, the signal propagates to the right. (Other bidirectional buffers may also be used with the invention, for example, those described by Carter in U.S. Pat. No. 4,695,740 [M-214] and by Hsieh in U.S. Pat. No. 4,835,418 [M-615]).

Each tristate enable line E1 through E4 is also connected to inputs of two OR gates. Assume that the signal on line S2 from logic unit 26B is to be applied to line segment 19B and detected by structures connected to line segments 19A and 19C. To apply the signal on line S2 to bus segment 19B, logic block 26B applies a high signal to tristate enable line E2 to turn on buffer B2. In order for the signal to be forwarded to line segments 19A and 19C, bidirectional buffers 11A and 11C must be programmed to direct the signal away from its source. Thus, tristate enable line E2 from logic block 26B, in addition to enabling buffer B2, also provides input on lines 49 and 43 to OR gates ORA2 and ORB1 for controlling bidirectional buffers 11A and 11B, respectively. One can see that when a high signal is applied to line E2, three things happen: tristate buffer B2 is enabled, bidirectional buffer 11A is configured to forward signals to the left, and bidirectional buffer 11B is configured to forward signals to the right.

Similarly, line E1 for enabling buffer B1 is also connected on lines 50 and 44 to OR gates ORA2 and ORB1 respectively; line E3 for enabling buffer B3 is also connected on lines 48 and 42 to OR gates ORA2 and ORB1 respectively; and line E4 for enabling buffer B4 is also connected on lines 47 and 41 to OR gates ORA2 and ORB1. Equivalent structures exist to the left and right of the portion of structure shown in FIG. 2. Unless there is a design error, no more than one tristate enable line will simultaneously carry a high signal. Thus there will be no contention.

Note that in the embodiment of FIG. 2, OR gates have been shown for controlling direction of the bidirectional buffers. This is because the embodiment of FIG. 2 uses an active high enable signal for enabling tristate buffers. In another embodiment using active low tristate buffer enable signals, the OR gates are replaced with NAND gates. Other logic gates also accomplish the same purpose in other embodiments.

Control Propagates to Distant Bidirectional Buffers

As an important aspect of the invention, the high signal on a single tristate buffer enable line such as E2 controls the directions not only of the bidirectional buffers immediately to the left and right of the line segment being driven but the more distant bidirectional buffers to the left and right, so that signal flow is away from the source for the entire length of the bus line. Consider that a tristate buffer (not shown) connected to line segment 19A will drive the bus line comprising line segments 19A, 19B, and 19C. A high signal on a tristate buffer for driving line segment 19A will cause a high signal to be applied to one of the inputs to OR gate ORA1. Thus OR gate ORA1 will provide a high output signal. This high signal is applied to transistor T4, which in combination with transistor T2 being turned on by a low output signal from OR gate ORA2 causes bidirectional buffer 11A to direct signals to the right. Line 45 (shown in bold) carries this high signal from the output of OR gate ORA2 to OR gate ORB1 so that OR gate ORB1 causes bidirectional buffer 11B to direct signals to the right. Repeated structures to the right of those shown also cause additional bidirectional buffers not shown to conduct to the right. When one signal source ceases to use the bus and another takes over, the high signal on a different tristate buffer line causes the direction of bidirectional buffers to change to accommodate the new signal source.

Figure 3:
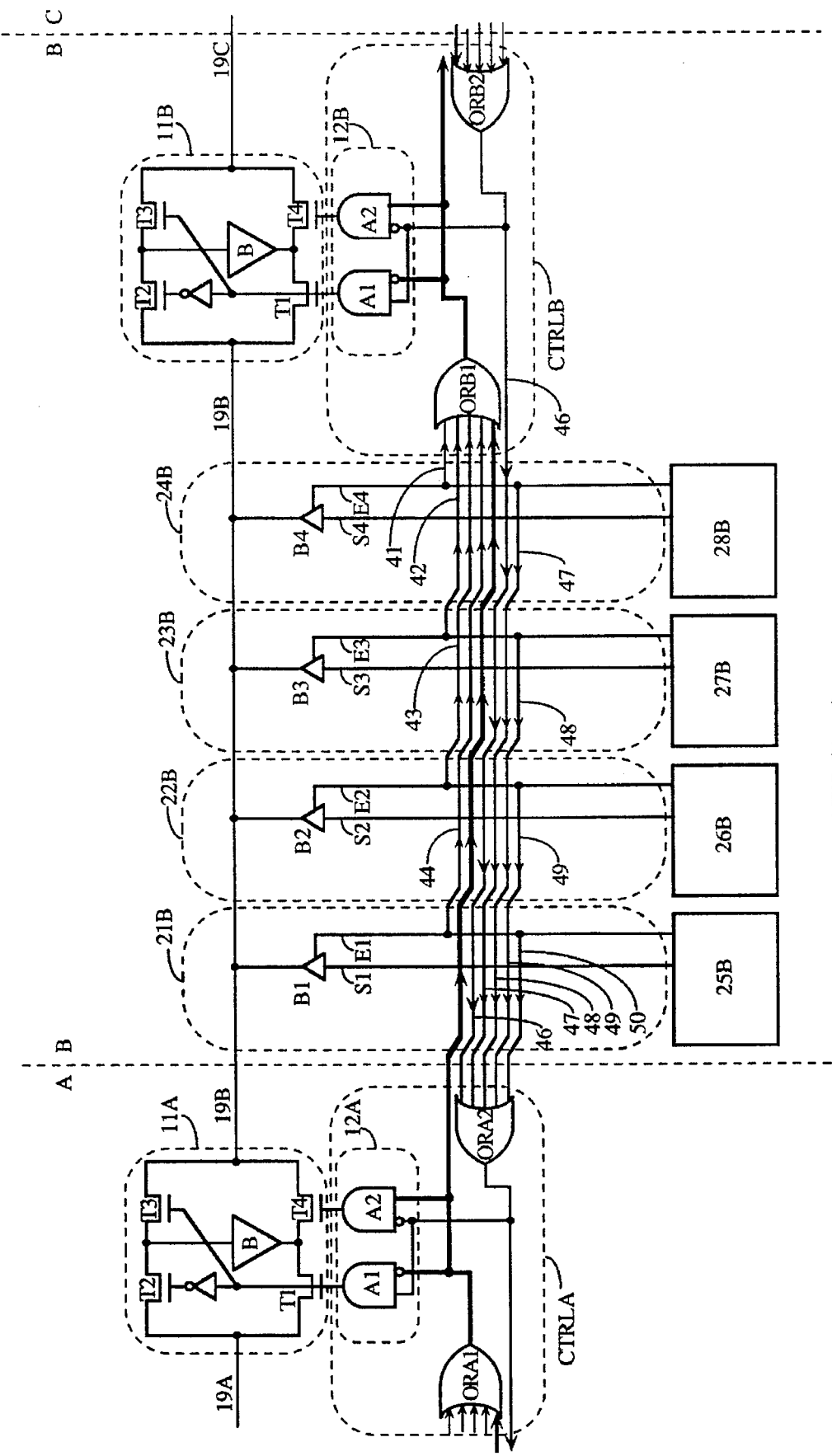
FIG. 3 illustrates a second embodiment of the invention for protecting against race conditions.

Race Contention—FIG. 3

Depending upon the characteristics of the various components in the chip, there may be undesirable race conditions as the signal source switches from one part of a bus line to another. Although such switching is under control of a single clock signal, the clock signal may be skewed to arrive at one location before another, and a signal on a bus line may continue to be driven by one bidirectional buffer after a new tristate buffer has been enabled and has started driving the line. For example, looking at FIG. 1, consider that during a first clock cycle, a tristate buffer controlled by logic block 28A has placed a logic 1 signal onto line 19A and has caused bidirectional buffers 11A, 11B, and 11C to drive the signal to the right onto segment 19C. During a second clock cycle, logic block 28A turns off its bidirectional buffer, and therefore OR gates which propagate the signal to the right will turn off. But this takes a finite amount of time.

During this second clock cycle, consider that logic block 28C applies a logic 0 to segment 19C. There may be a time period during which OR gate ORB1 is still responding to the previous high signal from the left and is therefore still applying the logic 1 signal to line segment 19C while logic block 28C is trying to apply a logic 0 signal to line segment 19C. This produces contention between a pull-up transistor in buffer B of bidirectional buffer 11B and a pull-down transistor in the tristate buffer driven by logic block 28C. Also, if both directions in bidirectional buffer 11B are on simultaneously (transistors T2 and T3 are on simultaneously), there may be a high current condition due to an intermediate input voltage to buffer B. These race contention conditions are avoided in the embodiment of FIG. 3.

In FIG. 3, bidirectional buffers 11A and 11B are each controlled by two control signals from race contention control units 12A and 12B respectively, each of which in the embodiment of FIG. 3 comprises two AND gates A1 and A2.

Looking at race contention control unit 12A, AND gates A1 and A2 are both controlled by both of OR gates ORA1 and ORA2. A high signal from OR gate ORA1 disables AND gate A1 regardless of the signal on OR gate ORA2. Likewise, a high signal on OR gate ORA2 disables AND gate A2 regardless of the signal on OR gate ORA1. Only if OR gate ORA2 carries a low signal will a high signal from OR gate ORA1 cause AND gate A2 to turn on transistor T4 to establish a bidirectional buffer 11A direction to the right. Likewise, only if OR gate ORA1 carries a low signal will a high signal from OR gate ORA2 cause AND gate A1 to turn on transistors T1 and T3 to establish a bidirectional buffer direction to the left. If both of OR gates ORA1 and ORA2 carry high signals, transistors T1, T3, and T4 will all be off, placing bidirectional buffer 11A into a high impedance mode, and only transistor T2 will be on, to prevent the input of buffer B from floating. Thus a race condition, or a design error, will not produce the contention which may occur in the embodiment of FIG. 2.

Figure 4:
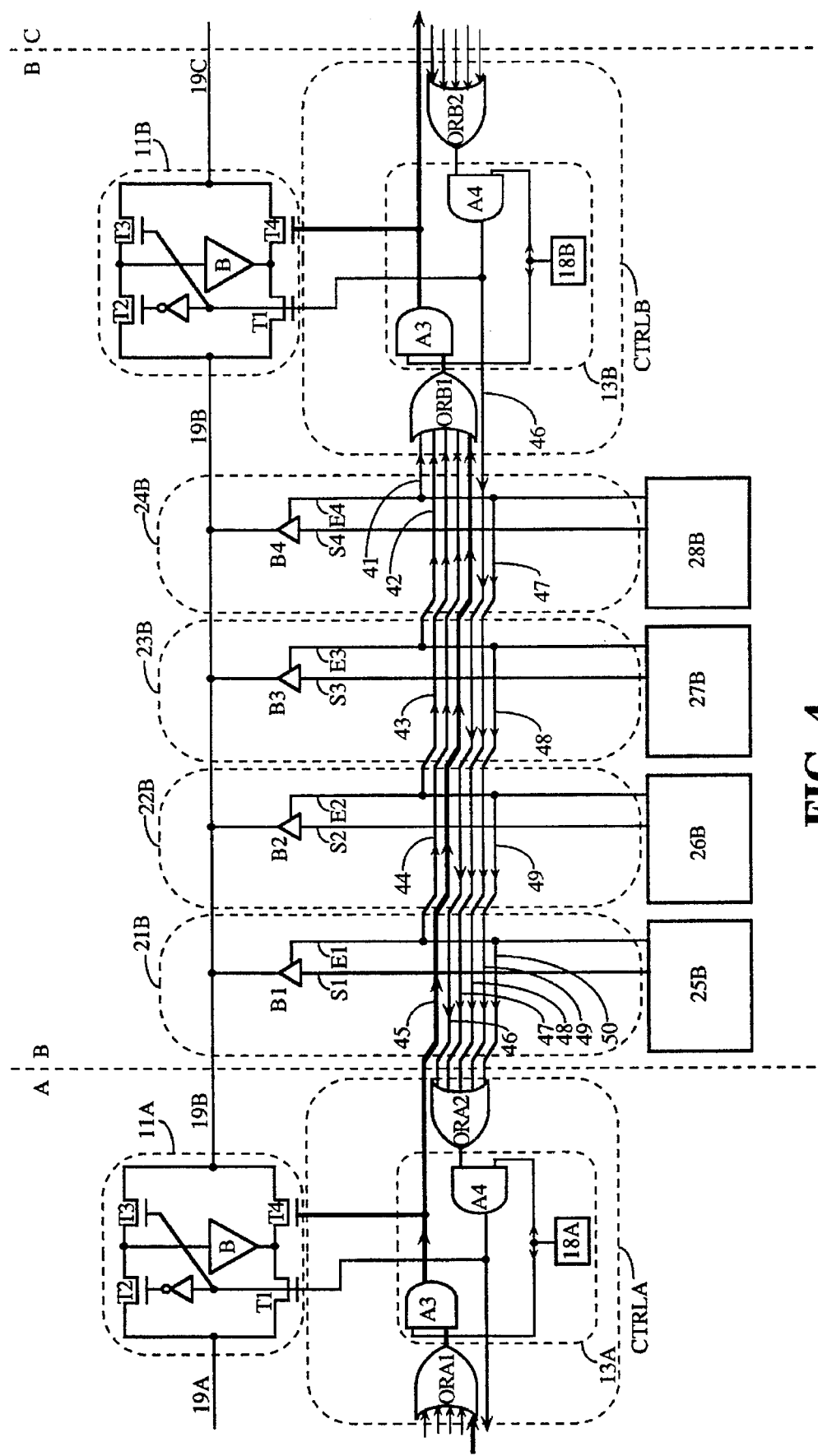
FIG. 4 illustrates a third embodiment of the invention for allowing a user to form buses of selectable length.

Segmentable Bus—FIG. 4

FIG. 4 shows another embodiment which offers the additional flexibility of forming separate bus lines from a set of line segments. In FIG. 4, each bidirectional buffer 11A or 11B may be placed into a permanent high impedance state by a high impedance control unit 13A or 13B, separating the line segments on either side into separate buses.

AND gates A3 and A4 are controlled by a memory cell as well as OR gates. In bidirectional buffer 11A, AND gates A3 and A4 are controlled by memory cell 18A in high impedance control unit 13A. AND gate A3 receives the output signal from OR gate ORA1 and AND gate A4 receives the output signal from OR gate ORA2.

When memory cell 18A provides a high signal, the structure of FIG. 4 performs as does the structure of FIG. 2. That is, OR gate ORA1 controls transistor T4 as well as providing input on line 45 to OR gate ORB1 to the right. Likewise, OR gate ORA2 controls transistors T1, T2, and T3 as well as an OR gate, not shown, to the left.

When memory cell 18A carries a low signal, AND gates A3 and A4 both provide low output signals, which place bidirectional buffer 11A into a high impedance mode and provide constant low signals to OR gates to the left and right. Thus, a signal applied to a line segment to the left of bidirectional buffer 11A has no effect on the signal on a line segment to the right of bidirectional buffer 11A. This way, segments to the left and right of bidirectional buffer 11A can be driven and controlled separately. Memory cell 18B has the equivalent effect on bidirectional buffer 11B. Making the bidirectional buffers tristarable is especially useful in larger chips in which different functions are performed in different parts of the chip.

Figure 5:
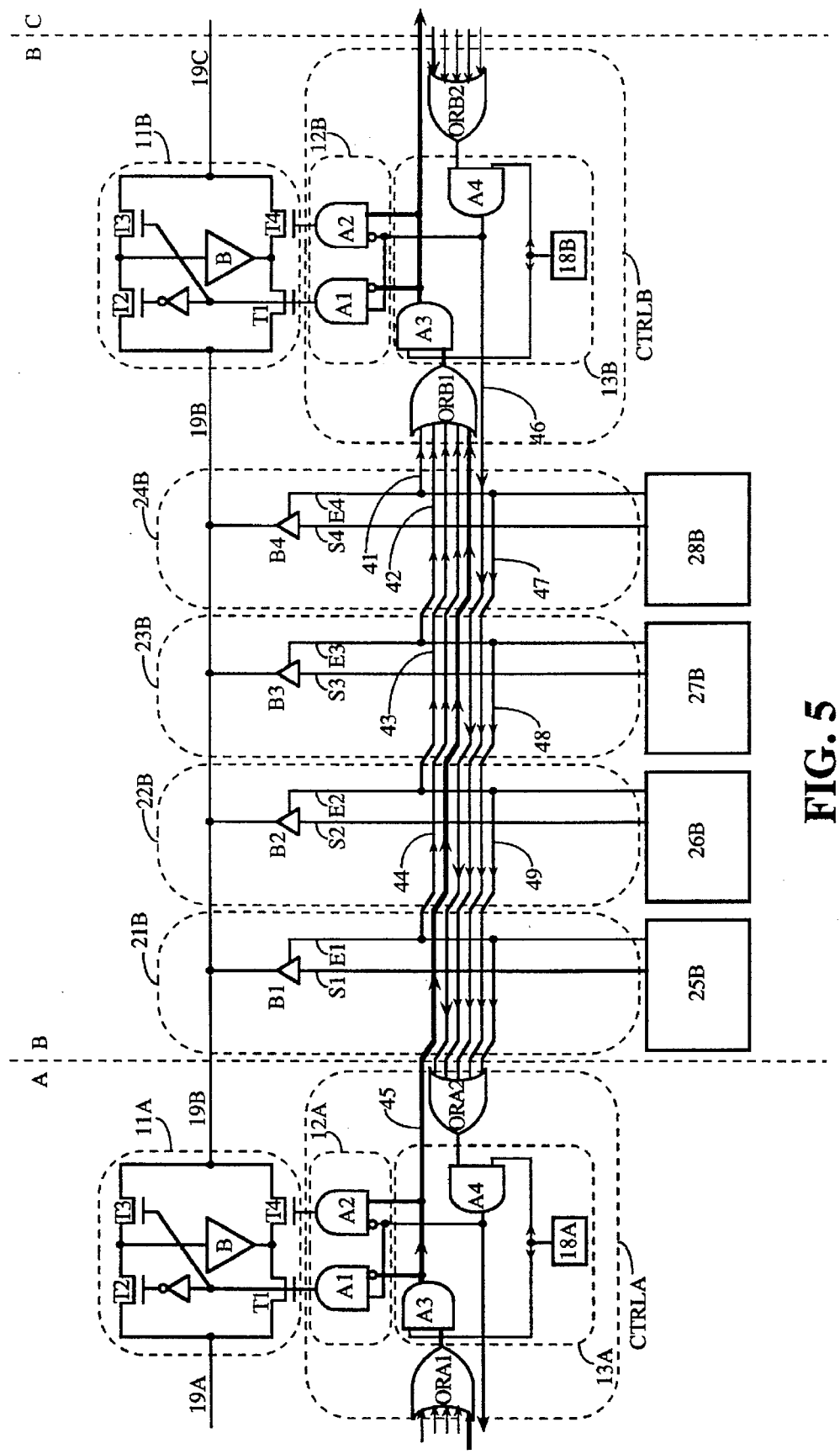
FIG. 5 illustrates a fourth embodiment of the invention for protecting against race conditions and allowing a user to select bus length.

Combined Structure—FIG. 5

The structure of FIG. 5 combines the race control and tristate features of FIGS. 3 and 4.

Considering the situation in which a signal on line S2 is to drive the bus, the high signal on line 43 causes OR gate ORB1 to apply a logical 1 to AND gate A3 in control unit CTRLB, which in combination with a high signal from memory cell 18B produces a logical 1 from AND gate A3. The high signal from AND gate A3 causes AND gate A1 to output a low signal which turns off transistors T1 and T3, and turns on transistor T2 so that the signal on line 19B is applied to buffer B. The high signal from AND gate A3 is also applied to AND gate A2. If no conflicting high signal is present on AND gate A4, AND gate A2 turns on transistor T4 so that buffer B in bidirectional buffer 11B propagates the signal on 19B to 19C.

Similarly, the high signal on line 49 causes OR gate ORA2 to apply a logical 1 to AND gate A4 in race contention control unit 12A, which in combination with a high signal from memory cell 18A produces a logical 1 from AND gate A4. The high signal from AND gate A4 causes AND gate A2 to output a low signal which turns off transistor T4. The high signal from AND gate A4 is also applied to AND gate A1. If no conflicting high signal is present on AND gate A3 in control unit CTRLA, AND gate A1 turns on transistors T1 and T3 so that buffer B in bidirectional buffer 11A propagates the signal on 19B to 19A. Thus the act of turning on tristate buffer B2 sets the directions of bidirectional buffers 11A and 11B to propagate the signal away from line 19B. The same is true of buffers B1, B3, and B4.

If a buffer for driving line 19A is turned on, OR gate ORA1 will carry a high signal and will cause bidirectional buffer 11A to propagate a signal to the right (assuming memory cell 18a stores a logic 1 and OR gate ORA2 is providing a logic 0 output signal). Since line 45 connects the output of AND gate A3 of race contention control unit 12A to OR gate ORB1, the buffer driving line 19A also causes bidirectional buffer 11B to propagate to the right (assuming memory cell 18b stores a logic 1 and OR gate ORB2 is providing a logic 0 output signal). The signal path by which a buffer for driving line 19A controls bidirectional buffers to the right is shown in bold.

Advantageously, the propagation time of a signal on a bus line to a bidirectional buffer is more closely matched to the propagation time of a control signal for controlling that bidirectional buffer. For example, if a signal on line S1 from logic block 25B is to be placed onto the bus including line segments 19A, 19B, and 19C, the tristate enable signal E1 for enabling buffer B1 will propagate more quickly to control unit CTRLA than to control unit CTRLB. Likewise, the signal on line S1 will propagate more quickly to bidirectional buffer 11A controlled by control unit CTRLA than to bidirectional buffer 11B controlled by control unit CTRLB.

Figure 6A:
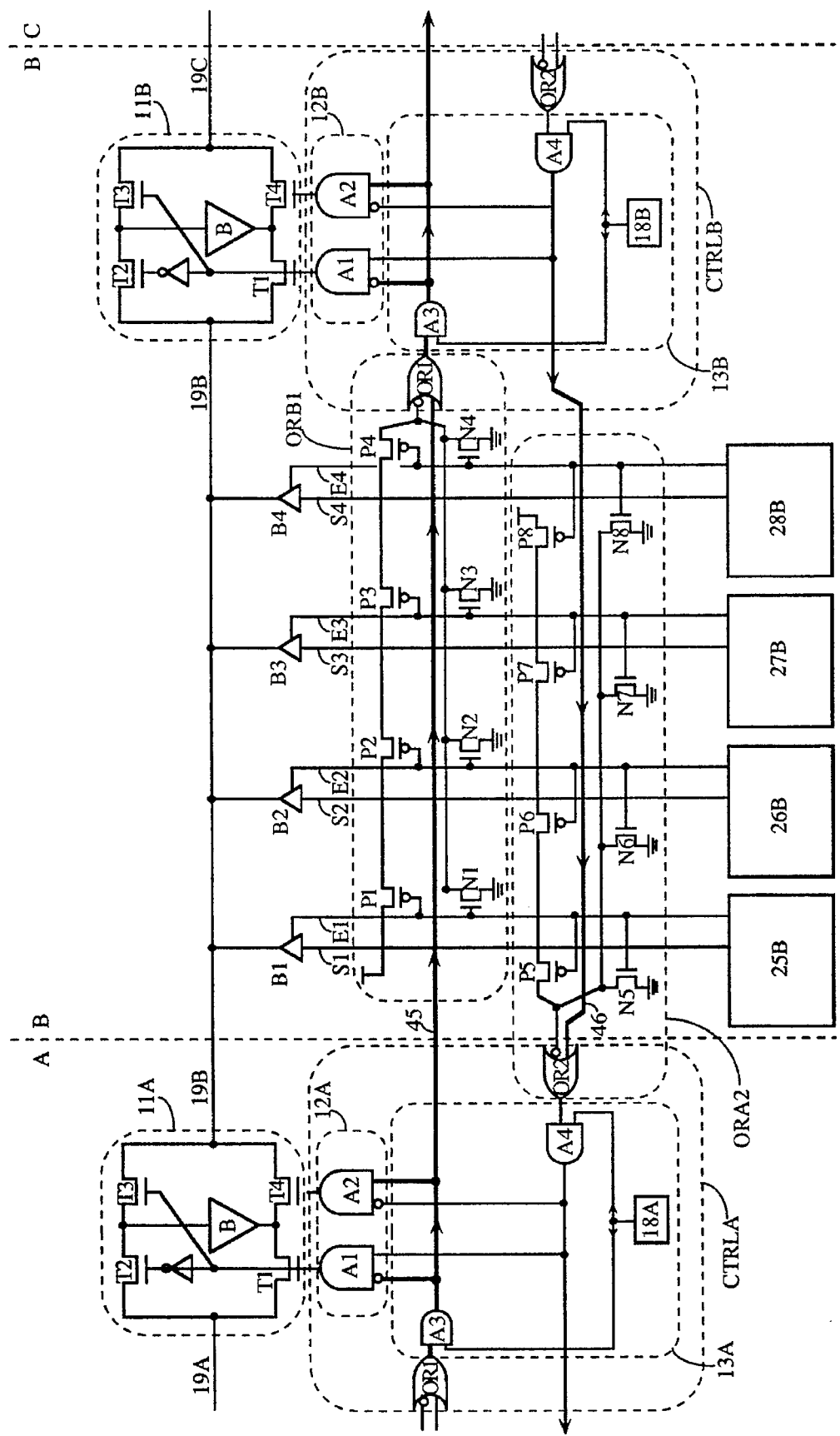
FIGS. 6a and 6b illustrate embodiments of the invention having distributed OR gates, one set for each direction.
Figure 6B:
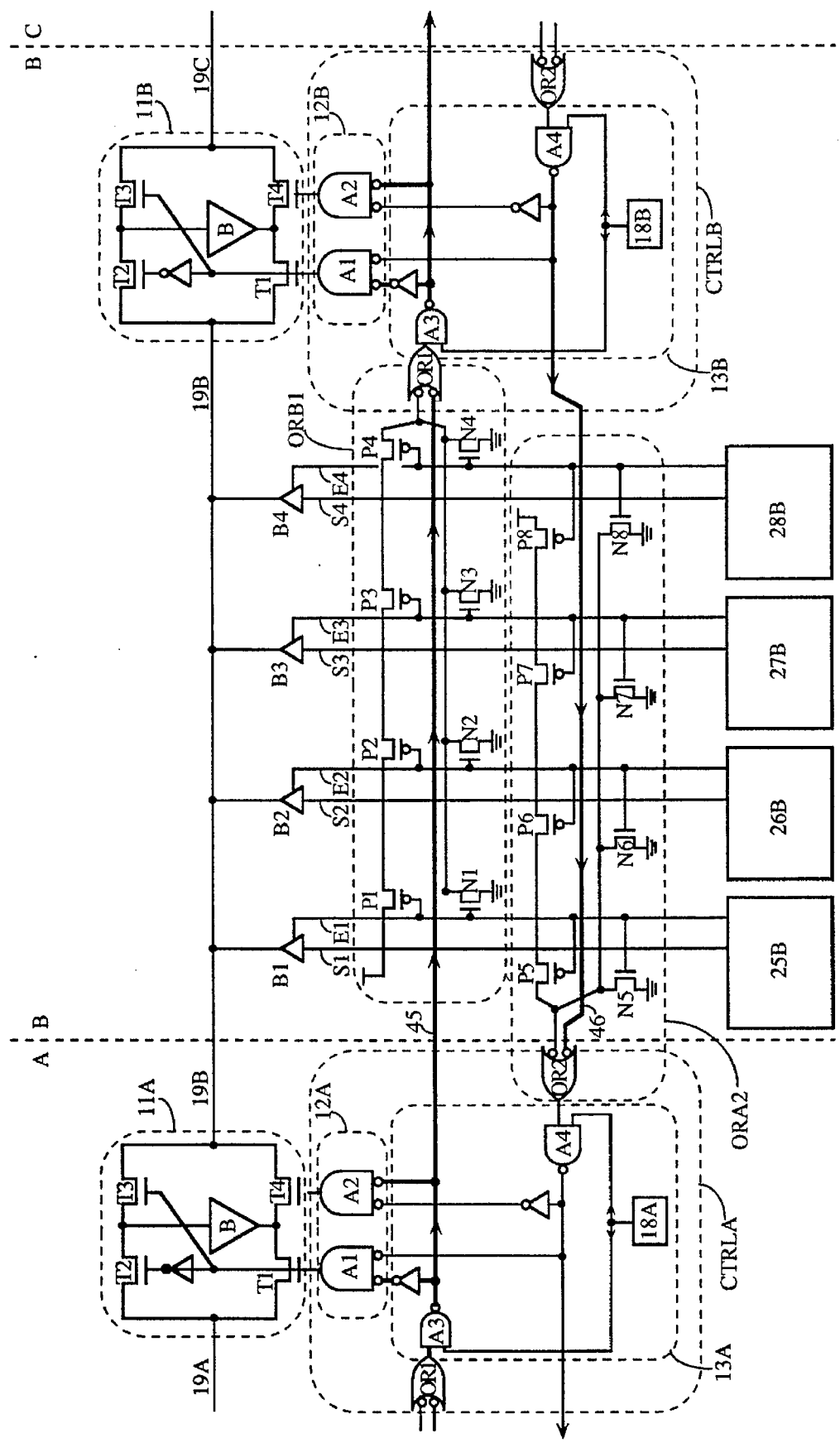

Distributed OR Gates—FIGS. 6a and 6b

FIG. 6a shows an embodiment in which the five-input OR gates ORA2 and ORB1 are physically distributed through the integrated circuit. As is typical for a CMOS OR gate or CMOS NOR gate, the structure comprises P-channel transistors in series between the positive supply voltage source and the output terminal, and N-channel transistors in parallel between the negative supply voltage source (ground). Here, as part of gate ORB1, P-channel transistors P1 through P4 are controlled respectively by tristate control lines E1 through E4 and N-channel transistors N1 through N4 are also controlled respectively by lines E1 through E4. Thus any high signal on a line E1 through E4 turns on a corresponding transistor N1 through N4, causing OR gate OR1 to provide a high output signal. OR gate OR1 also provides a high output signal if line 45 is high. If line 45 is low, the output signal on OR gate OR1 is high if any enable signals E1 through E4 are high. If line 45 is low, a combination of all low signals on E1 through E4 turns on all of transistors P1 through P4, causing OR gate OR1 to provide a low output signal. Only if no enable signal to the left of OR gate OR1 is high and the signal on line 45 is low will OR gate OR1 provide a low output signal, indicating that no tristate buffers to the left of CTRLB are enabled.

OR gate ORA2 is implemented and operates in an equivalent manner.

FIGS. 6a and 6b are not a layout drawings but generally illustrate the position of transistors which form the two CMOS NOR gates. In one embodiment, each of logic blocks 25B through 28B is part of a tile structure generally arranged as described in patent application Ser. No. 08/222,138 [M-2257-1N]. In the embodiments of FIGS. 6a and 6b, transistors P1, N1, P5, N5, and buffer B1 are formed within the tile which includes logic block 25B. Similarly, transistors P2, N2, P6, N6, and buffer B2 are formed within the tile which includes logic block 26B.

In addition to the advantage of matched propagation time, this physical arrangement has a second advantage: the line lengths of the tristate control lines needed to control the OR gates are minimized since the OR gate transistors are physically close to the tristate control lines. Thus, the metal area is reduced, and the overall structure may be more dense.

Figure 7:
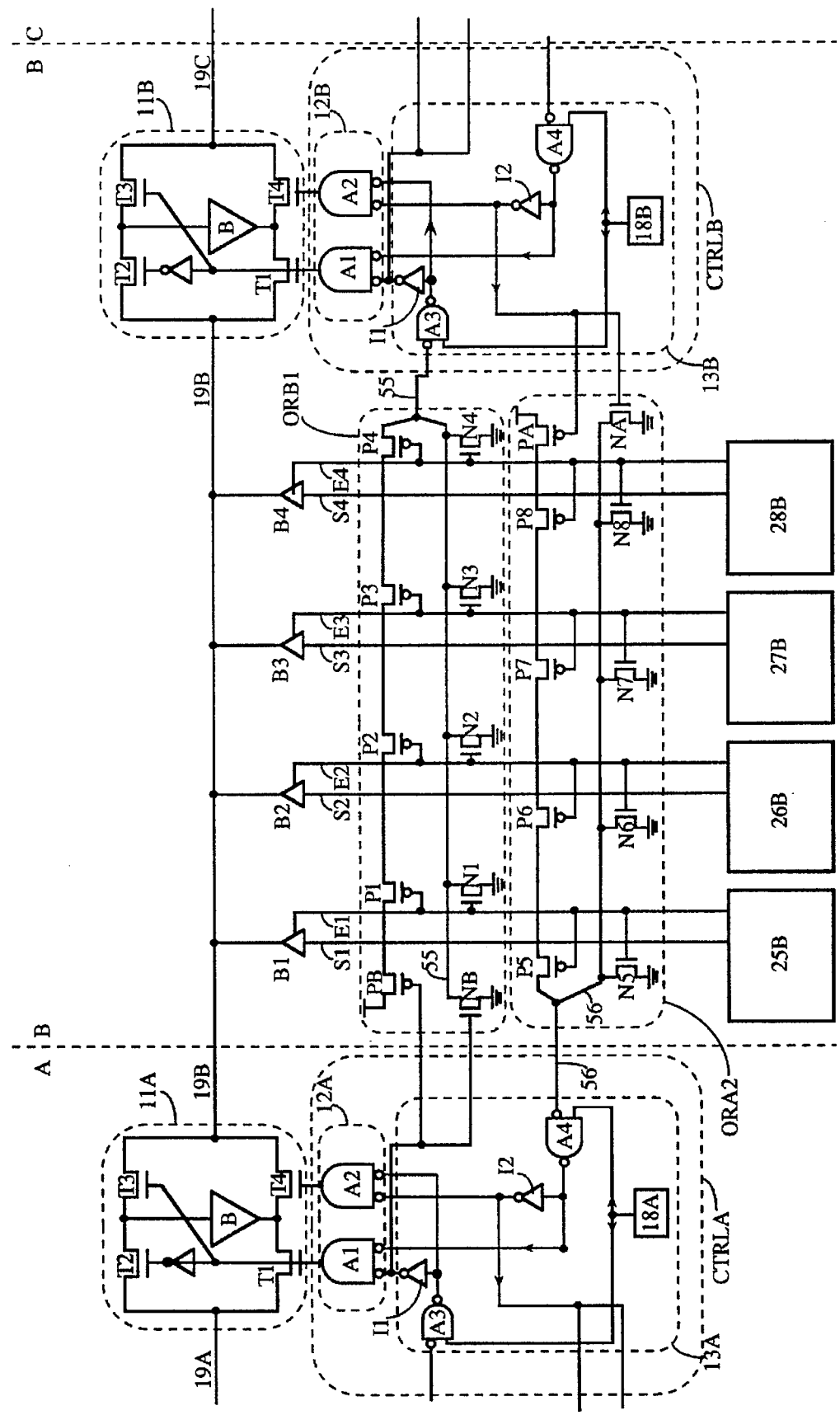
FIG. 7 illustrates another embodiment with distributed OR gates that combines the long distance input signal with the OR gate input signals.

Distributed OR Gates with Fast Path—FIG. 7

FIG. 7 shows an embodiment similar to FIGS. 6a and 6b, except that the long distance path from one bidirectional buffer control to another is incorporated into the OR gate so that NAND gates A5 and A6 of FIGS. 6a and 6b are eliminated. OR gate ORB1 includes P-channel transistor PB and N-channel transistor NB. For proper polarity, P-channel transistor PB and N-channel transistor NB are controlled from the output of inverter I1 in control unit CTRLA. Similarly OR gate ORA2 includes transistors PA and NA controlled from the output of inverter I2 in control unit CTRLB. The embodiment of FIG. 7 provides a speed improvement due to the buffering done by transistors PB, NB, PA, and NA. The embodiment of FIG. 7 also uses reduced metal area compared to FIGS. 6a and 6b.

Figure 8:
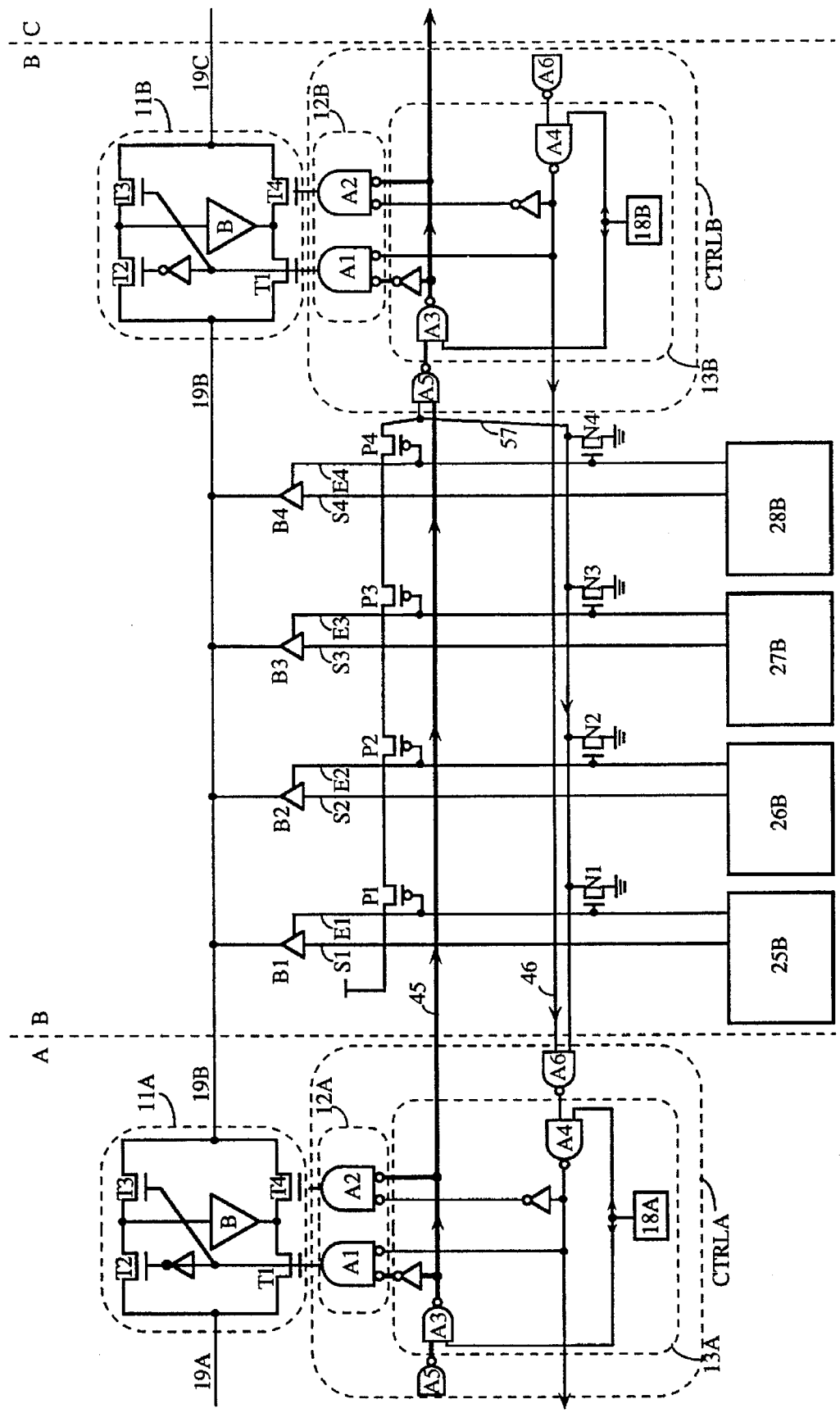
FIG. 8 illustrates another embodiment with one set of distributed OR gates for both directions of locally generated signals and fast paths in both directions.

Distributed OR Gates, Smaller Area—FIG. 8

FIG. 8 is similar to FIG. 7 except that only one NOR gate formed from transistors P1 through P4 and N1 through N4 collects enable signals E1 through E4 to the four tristate buffers B1 through B4. These signals are combined in NAND gates A5 and A6 with the signals on lines 45 and 46 respectively to control bidirectional buffers 11B and 11A respectively. The embodiment of FIG. 8 uses less area than that of FIG. 5 through 7 but loses a speed advantage because it does not match propagation times (for signals flowing left) as is done in FIGS. 5 through 7.

In light of the above description, many other embodiments of the invention can be derived by those skilled in the art. Such embodiments are intended to fall within the scope of the present invention.

We claim:

1. A bus structure comprising:
   (a) a bus line;
   (b) at least one bidirectional buffer separating said bus line into at least two bus line segments;
   (c) for each said bus line segment, at least one tristate buffer for controllably applying a signal to said bus line segment, said tristate buffer receiving an input signal on a tristate buffer input signal line and an enable signal on a tristate buffer enable signal line, and applying said input signal to said bus line segment in response to an enable signal on said tristate buffer enable signal line;
   (d) at least one control unit for controlling the direction of said at least one bidirectional buffer, said control unit being controlled by signals from said tristate buffer enable signal lines to direct said bidirectional buffer to carry said signal applied to said bus line segment away from said tristate buffer input signal line.

2. A bus structure as in claim 1 in which said at least one control unit for controlling the direction of said at least one bidirectional buffer comprises a race contention control unit receiving signals from enable signal line to the left and right, having a structure which places said bidirectional buffer into a high impedance state in response to enable signal line from both left and right.

3. A bus structure as in claim 1 in which said at least one control unit for controlling the direction of said at least one bidirectional buffer comprises a high impedance control unit which places said bidirectional buffer into a high impedance state in response to a high impedance control signal.

4. A bus structure as in claim 1 in which
   said at least one control unit for controlling the direction of said at least one bidirectional buffer is controlled by a plurality of enable signals from a corresponding plurality of enable signal lines; and
   said at least one control unit comprises at least one logic gate having transistors distributed to tiles in which enable signals for controlling said transistors are generated.

\* \* \* \* \*